(12) United States Patent
Motoki et al.

(10) Patent No.: US 9,725,944 B2
(45) Date of Patent: Aug. 8, 2017

(54) VEHICLE DOOR OPEN-CLOSE CONTROL DEVICE

(71) Applicants: Masayuki Motoki, Aichi (JP); Hidemitsu Kawashima, Aichi (JP); Hirohito Miyazaki, Gifu (JP)

(72) Inventors: Masayuki Motoki, Aichi (JP); Hidemitsu Kawashima, Aichi (JP); Hirohito Miyazaki, Gifu (JP)

(73) Assignee: OMRON AUTOMOTIVE ELECTRONICS CO., LTD., Aichi (JP)

( * ) Notice: Subject to any disclaimer, the term of this patent is extended or adjusted under 35 U.S.C. 154(b) by 0 days.

(21) Appl. No.: 15/043,843

(22) Filed: Feb. 15, 2016

(65) Prior Publication Data

US 2016/0265263 A1  Sep. 15, 2016

(30) Foreign Application Priority Data

Mar. 9, 2015  (JP) .................................. 2015-046145

(51) Int. Cl.
*B60R 25/20* (2013.01)
*E05F 15/73* (2015.01)
(Continued)

(52) U.S. Cl.
CPC ................. *E05F 15/73* (2015.01); *B60J 5/10* (2013.01); *B60R 25/2054* (2013.01);
(Continued)

(58) Field of Classification Search
CPC ........ B60Q 9/006; B60Q 9/007; B60Q 9/008; G01S 7/04; G01S 13/931; G01S 2013/9371; G01S 2013/9375; E05F 15/73; E05F 15/60; E05F 15/70; E05F 15/611; E05Y 2900/546; E05Y 2900/536; E05Y 2400/858; E05Y 2900/50; G07C 9/00126; G07C 9/00714; G07C 2209/64;
(Continued)

(56) References Cited

U.S. PATENT DOCUMENTS 6,606,027 B1 * 8/2003 Reeves .................. B60Q 9/006
340/435
8,922,340 B2 * 12/2014 Salter ...................... E05B 81/76
340/426.28
(Continued)

FOREIGN PATENT DOCUMENTS

JP  2014-009470 A  1/2014
JP  2014-500414 A  1/2014

*Primary Examiner* — Ali Neyzari
(74) *Attorney, Agent, or Firm* — Osha Liang LLP

(57) ABSTRACT

A detector includes a plurality of sensors and is configured to detect a user in preliminarily set detection areas. The sensors are arrayed horizontally at a rear portion of a vehicle such that the detection areas of the adjacent sensors overlap with each other. If any one of the sensors detects the user and outputs a detection signal (first detection signal), a threshold for a detection signal of one of the sensors adjacent to the sensor (second detection signal) is raised and the first and second detection signals are converted to first and second binary signals, respectively. A rear door is opened if the second binary signal has an output period that is contained in an output period of the first binary signal.

5 Claims, 13 Drawing Sheets

(51) Int. Cl.
*G07C 9/00* (2006.01)
*E05B 81/76* (2014.01)
*B60J 5/10* (2006.01)

(52) U.S. Cl.
CPC .......... *E05B 81/76* (2013.01); *G07C 9/00126* (2013.01); *E05Y 2400/858* (2013.01); *E05Y 2900/50* (2013.01); *E05Y 2900/536* (2013.01); *E05Y 2900/546* (2013.01); *H03K 2217/96078* (2013.01)

(58) Field of Classification Search
CPC .......... E05B 81/76; E05B 81/77; E05B 81/00; E05C 19/02; B60R 25/2054; H03K 17/955; H03K 2217/96078; B60J 5/10; B60J 5/00
USPC ...... 340/5.7, 5.2, 5.72, 436, 435, 903; 49/31
See application file for complete search history.

(56) References Cited

U.S. PATENT DOCUMENTS

| | | | |
|---|---|---|---|
| 9,290,982 B2* | 3/2016 | Schuetz | E05F 15/73 |
| 9,447,613 B2* | 9/2016 | Salter | E05B 81/76 |
| 2013/0234828 A1 | 9/2013 | Holzberg et al. | |
| 2016/0251891 A1* | 9/2016 | Herthan | B60R 25/2054 49/31 |

\* cited by examiner

VEHICLE DOOR OPEN-CLOSE CONTROL DEVICE

CROSS-REFERENCE TO RELATED APPLICATION

This application is based on Japanese Patent Application No. 2015-046145 filed with the Japan Patent Office on Mar. 9, 2015, the entire contents of which are incorporated herein by reference.

FIELD

The disclosure relates to a vehicle door open-close control device configured to contactlessly open a vehicle door.

BACKGROUND

There have been known door open-close systems configured to detect a leg motion and automatically open a vehicle door even when a vehicle user carries baggage with both hands. For example, JP 2014-500414 W discloses a door open-close system including first and second sensors disposed at different sites at a vehicle rear portion and configured to detect a leg motion.

FIGS. 16 and 17 are views depicting disposition of the sensors according to JP 2014-500414 W. FIG. 16 is a rear view of a vehicle 100 whereas FIG. 17 is a side view of the vehicle 100. The vehicle 100 includes a vehicle body 1, a rear door 2, a rear bumper 3, a rear window 4, tires 5, a first sensor 60, and a second sensor 70.

The first sensor 60 is disposed at the rear bumper 3 whereas the second sensor 70 is disposed at the bottom of a rear portion (in a B direction) of the vehicle body 1. The sensors 60 and 70 each have a long and narrow detection area extending in a Y direction. These detection areas are disposed spaced from each other. The detection area of the first sensor 60 projects beyond the detection area of the second sensor 70 at the ends in the Y direction.

The door open-close system detects a time difference between an output signal from the first sensor 60 and an output signal from the second sensor 70. If the time difference satisfies a predetermined criterion, the door open-close system determines that a leg 6 has executed a kicking motion to insert the tip end of the leg 6 between the vehicle body 1 and a ground surface G as depicted in FIG. 17, regards the motion of the leg as a command to open the door, and opens the rear door 2. If the time difference does not satisfy the predetermined criterion, the door open-close system determines that the motion of the leg 6 does not correspond to a command to open the door, and does not open the rear door 2. This configuration thus prevents erroneous detection.

As apparent from FIG. 17, the second sensor 70 is disposed at a far portion (in an F direction) of the bottom of the vehicle body 1 with respect to the first sensor 60 in the door open-close system according to JP 2014-500414 W. The second sensor 70 can thus be restrained in terms of its mounting position.

Meanwhile, JP 2014-9470 A discloses a door open-close system configured to determine, when detecting a user in a detection area around a rear door, whether or not its detection pattern corresponds to a preliminarily set detection pattern, and open the rear door if the detection pattern corresponds to the preliminarily set detection pattern.

This door open-close system has a plurality of detection areas and detects the user in each of the detection areas so as to be distinguishable between these detection areas. According to the detection pattern thus set, the user is detected in a preliminarily set order of the detection areas. The door open-close system is configured to open the rear door only in a case where the user is detected in the predetermined order of the detection areas and thus prevents erroneous detection.

However, the door open-close system according to JP 2014-9470 A needs to have a plurality of detection patterns that cover user's behavior as well as a control program that covers these detection patterns. The door open-close system is thus complicated in its design and processing. The door open-close system also needs to include a high capacity memory configured to store these patterns and program.

SUMMARY

One or more embodiments of the disclosure provide a vehicle door open-close control device that has a simple configuration and can prevent erroneous detection with no restraint on sensor mounting positions.

A vehicle door open-close control device according to one or more embodiments of the disclosure includes: a detector disposed in the vicinity of a vehicle door and configured to detect a user in a preliminarily set detection area, and a controller configured to open the vehicle door if the detector detects the user. The detector includes a plurality of sensors horizontally arrayed in the vicinity of the door, and the plurality of sensors is disposed so as to allow detection areas of adjacent sensors to overlap with each other. The controller compares, when any of the sensors detects the user, a first detection signal of the sensor and a second detection signal of one of the sensors adjacent to the sensor, and opens the door if the detection signals satisfy a predetermined relation.

The vehicle door open-close control device thus configured does not need the sensor at the far portion of the bottom of the vehicle body as in JP 2014-500414 W, and has no restraint on sensor mounting positions. The door is opened when the first and second detection signals satisfy the predetermined relation as a result of comparison between the detection signals. Accordingly, the vehicle door open-close control device does not need the plurality of detection patterns or the control program that covers the detection patterns as in JP 2014-9470 A. The vehicle door open-close control device is thus simplified in its design and processing, and can prevent erroneous detection in such a simple configuration.

In one or more embodiments of the disclosure, optionally, the controller converts the first detection signal to a first binary signal with reference to a first threshold set to a predetermined signal level and converts the second detection signal to a second binary signal with reference to a second threshold larger than the first threshold, compares an output period of the first binary signal and an output period of the second binary signal, and opens the door if the output period of the second binary signal is contained in the output period of the first binary signal.

In one or more embodiments of the disclosure, optionally, the controller converts the first detection signal to a first binary signal with reference to a threshold set to a predetermined signal level and converts the second detection signal to a second binary signal with reference to the threshold, compares an output period of the first binary signal and an output period of the second binary signal, and opens the door if the output period of the second binary signal is contained in the output period of the first binary signal.

In one or more embodiments of the disclosure, optionally, the controller opens the door if the second binary signal rises after the first binary signal rises and the first binary signal falls after the second binary signal falls.

In one or more embodiments of the disclosure, optionally, the controller compares an output period of the first detection signal and an output period of the second detection signal at a predetermined signal level, and opens the door if the output period of the second detection signal is contained in the output period of the first detection signal.

As described above, one or more embodiments of the disclosure can provide a vehicle door open-close control device that has a simple configuration and can prevent erroneous detection with no restraint on sensor mounting positions.

DETAILED DESCRIPTION

Figure 1:
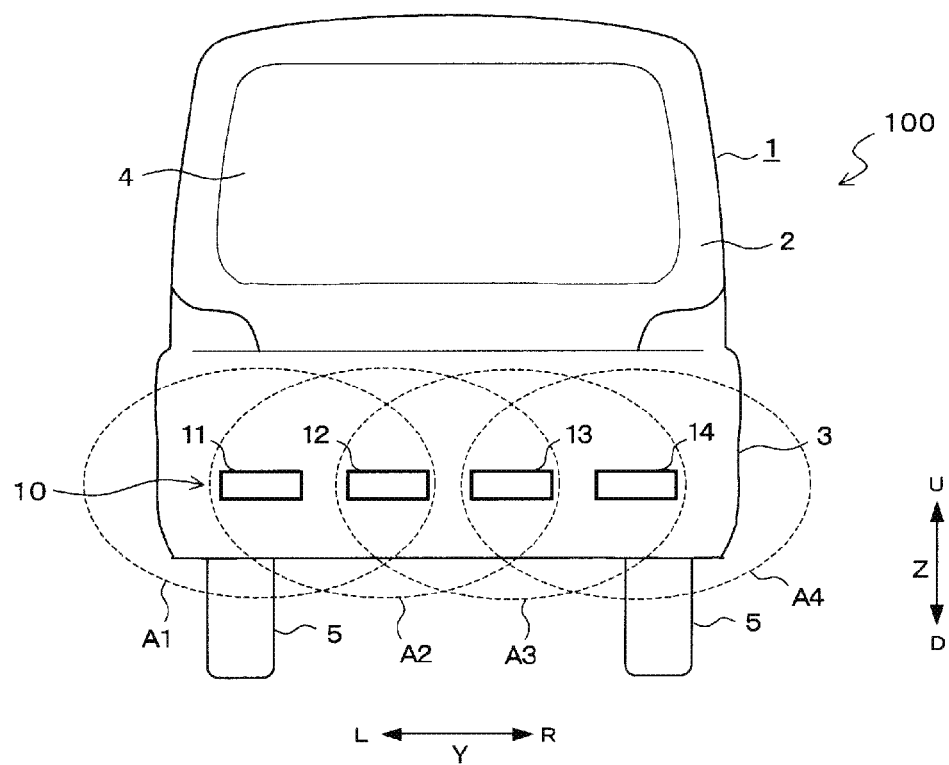
FIG. 1 is a rear view of a vehicle equipped with a vehicle door open-close control device according to one or more embodiments of the disclosure.

Embodiments of the disclosure invention will be described with reference to the drawings. In the drawings, the identical or equivalent component is designated by the identical numeral. In embodiments of the disclosure, numerous specific details are set forth in order to provide a more through understanding of the invention. However, it will be apparent to one of ordinary skill in the art that the invention may be practiced without these specific details. In other instances, well-known features have not been described in detail to avoid obscuring the invention.

Figure 2:
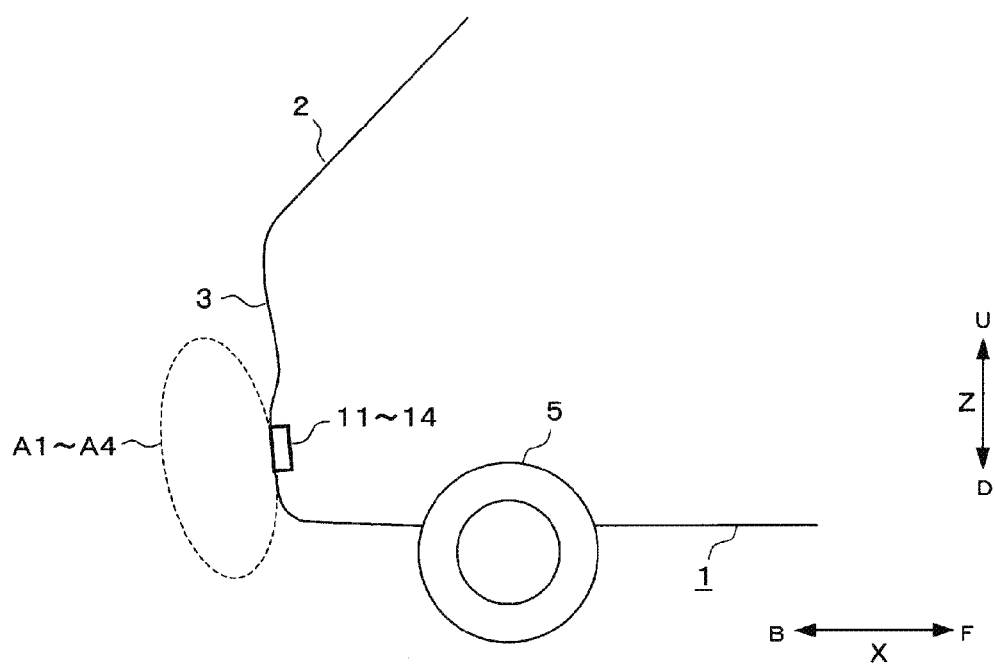
FIG. 2 is a partial side view of the vehicle.

A vehicle door open-close control device will be described initially in terms of its configuration with reference to FIGS. 1 to 3. FIG. 1 is a rear view of a vehicle 100 whereas FIG. 2 is a side view of the vehicle 100. In these figures, arrows X, Y, and Z indicate the anteroposterior direction, the lateral direction, and the vertical direction, respectively. Reference signs F, B, L, R, U, and D indicate the forward direction, the backward direction, the leftward direction, the rightward direction, the upward direction, and the downward direction, respectively.

In FIGS. 1 and 2, the vehicle 100 is a passenger car, and includes a vehicle body 1, a rear door 2, a rear bumper 3, a rear window 4, tires 5, and a detector 10.

The detector 10 includes a plurality of (four in this example) sensors 11 to 14 disposed in the vicinity of the rear door 2. The sensors 11 to 14 can be known capacitance proximity sensors. These sensors 11 to 14 are arrayed at the rear bumper 3 with predetermined spaces therebetween in the horizontal direction (Y direction). The sensors 11 to 14 have equivalent detection sensitivity and equivalent detection areas A1 to A4 indicated with broken lines, respectively. The detection areas A1 to A4 expand in the lateral direction Y and in the vertical direction Z as indicated in FIG. 1 and also extend in the anteroposterior direction X as indicated in FIG. 2. As apparent from FIG. 1, the detection areas of the adjacent sensors partially overlap with each other in the sensor array direction (Y direction). A leg motion to be described later is detected in these overlapping detection areas.

Figure 3:
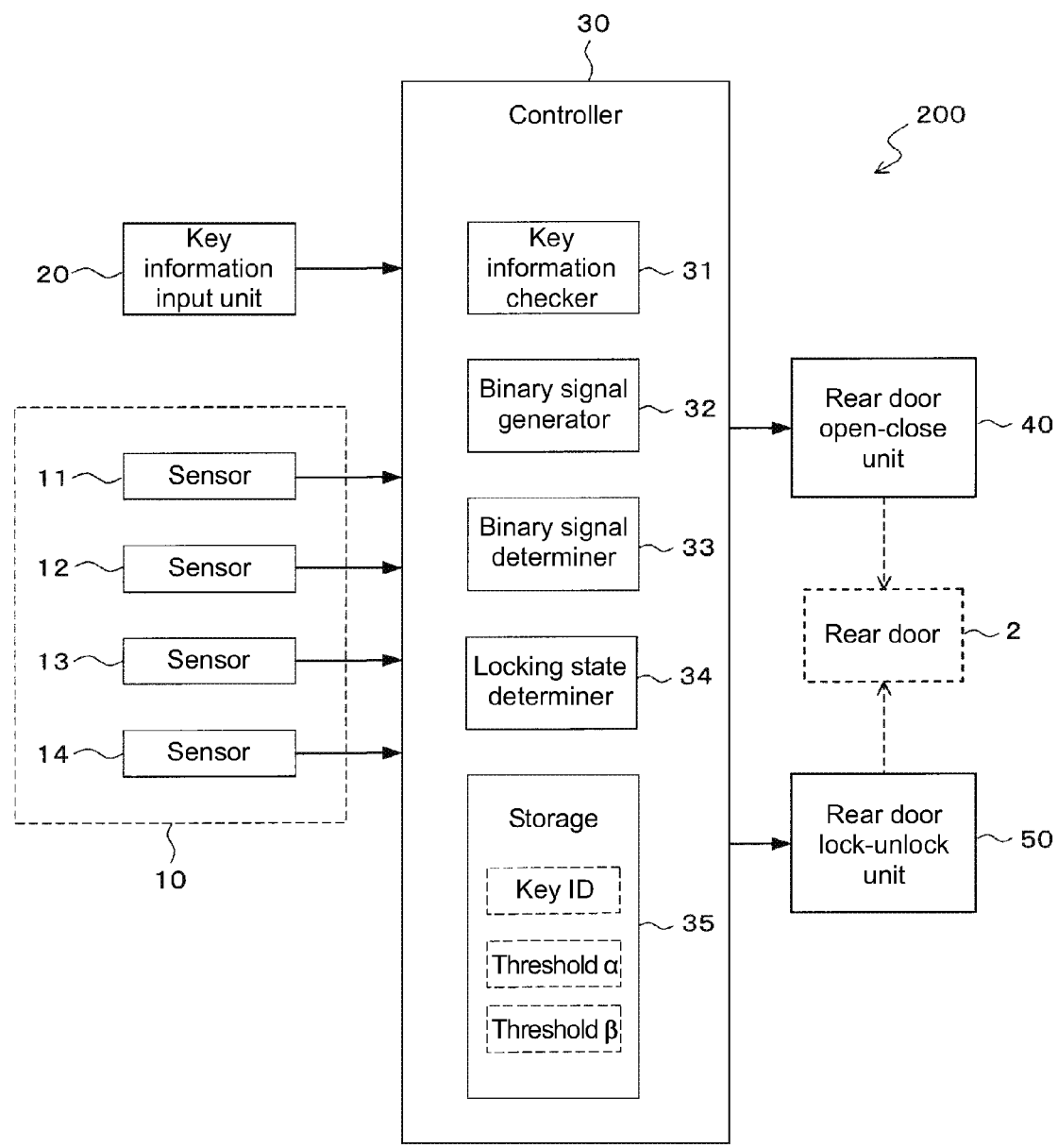
FIG. 3 is a block diagram of the vehicle door open-close control device.

FIG. 3 is a block diagram of an electrical configuration of the vehicle door open-close control device. A vehicle door open-close control device 200 is mounted on the vehicle 100, and includes the detector 10 provided with the sensors 11 to 14, a key information input unit 20 configured to receive key information, a controller 30 configured to control a movement of the rear door 2, a rear door open-close unit 40 configured to open or close the rear door 2, and a rear door lock-unlock unit 50 configured to lock or unlock the rear door 2. FIG. 3 depicts only the blocks relevant to one or more embodiments of the disclosure.

The key information input unit 20 includes a receiving circuit configured to receive key information transmitted from a portable machine (not depicted) carried by a vehicle user, and the like. The controller 30 is configured by a CPU, a memory, and the like, and includes a key information checker 31, a binary signal generator 32, a binary signal determiner 33, a locking state determiner 34, and a storage 35. Software actually achieves functions of the blocks of the key information checker 31 to the locking state determiner 34.

The rear door open-close unit 40 includes a motor configured to open or close the rear door 2, a driving circuit configured to drive the motor, and the like. The rear door lock-unlock unit 50 includes an actuator configured to lock or unlock the rear door 2, a driving circuit configured to drive the actuator, and the like.

In the controller 30, the key information checker 31 checks whether or not key information (a key ID of the portable machine) received from the key information input unit 20 and a key ID stored in the storage 35 match each other. The binary signal generator 32 converts detection signals outputted from the sensors 11 to 14 to binary signals with reference to thresholds $\alpha$ and $\beta$ stored in the storage 35. Details thereof are to be described later. The binary signal determiner 33 determines whether or not the binary signals of the adjacent sensors satisfy a predetermined relation. Details thereof are also to be described later. The locking state determiner 34 determines whether or not the rear door 2 is being locked.

The vehicle door open-close control device 200 thus configured will be described next in terms of its behavior with reference to FIGS. 4 to 12B.

The portable machine (not depicted) carried by the user of the vehicle 100 periodically communicates with the vehicle 100 to transmit the key ID to the vehicle 100. The key information input unit 20 in the vehicle door open-close control device 200 receives the key ID. The key information checker 31 in the controller 30 compares the key ID of the portable machine received by the key information input unit 20 and the key ID stored in the storage 35, and determines that matching is successful if the key IDs match each other. Such successful matching is a precondition for opening the rear door 2.

Figure 4:
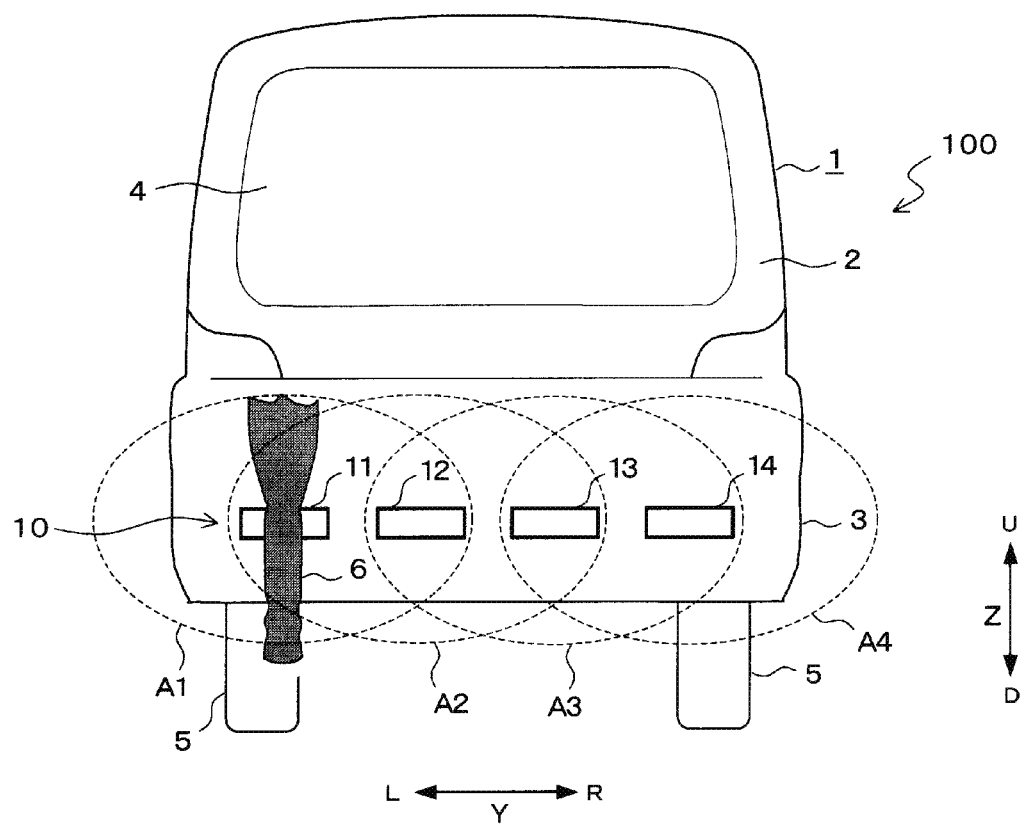
FIG. 4 is an explanatory view on leg detection by sensors.
Figure 5A:
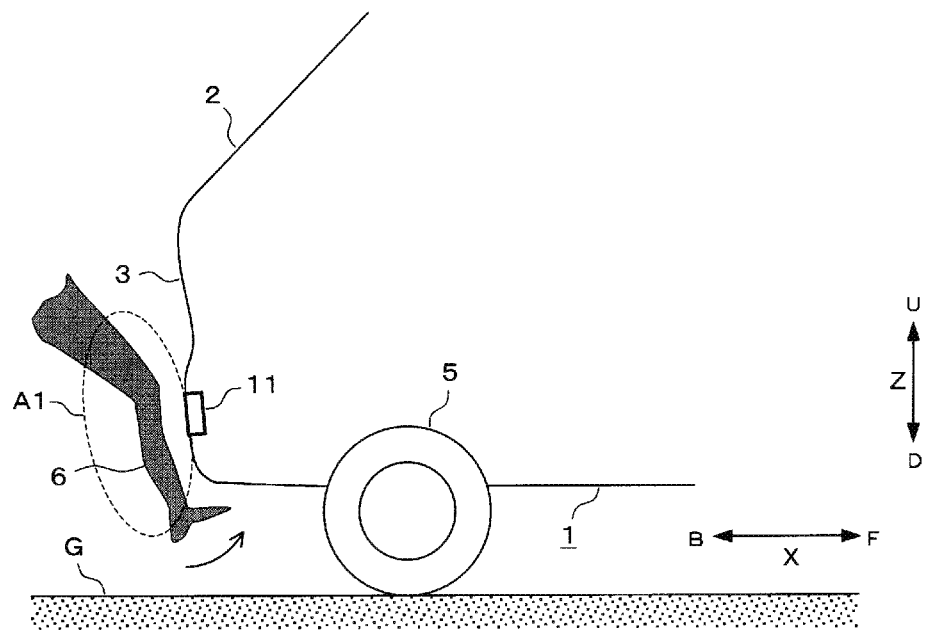
FIGS. 5A and 5B are explanatory partial side views on a leg motion in a vehicle anteroposterior direction.
Figure 5B:
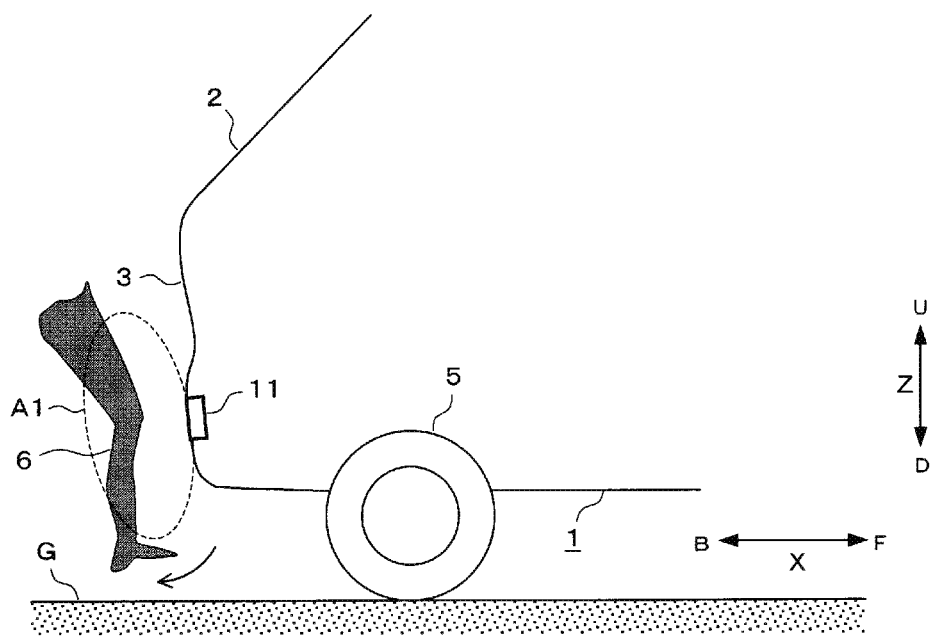

The user subsequently executes, behind the vehicle 100, a leg motion of kicking out to insert the tip end of the leg between the vehicle and the ground surface (hereinafter, referred to as a "kicking motion"). FIGS. 4 to 5B depict details of the kicking motion. The tip end of the leg is inserted between the vehicle body 1 and a ground surface G when the user kicks out forward (F direction) with a leg 6 as depicted in FIG. 5A at a position where the leg 6 faces any one of the sensors 11 to 14 (the sensor 11 in this example) as depicted in FIG. 4. When the leg 6 is subsequently drawn backward (B direction) as depicted in FIG. 5B, the tip end of the leg is taken out of the space between the vehicle body 1 and the ground surface G. The leg 6 is close to the sensor 11 in the state depicted in FIG. 5A, so that a detection signal outputted from the sensor 11 is increased in level. In contrast, the leg 6 is away from the sensor 11 in the state depicted in FIG. 5B, so that a detection signal outputted from the sensor 11 is decreased in level.

Figure 6:
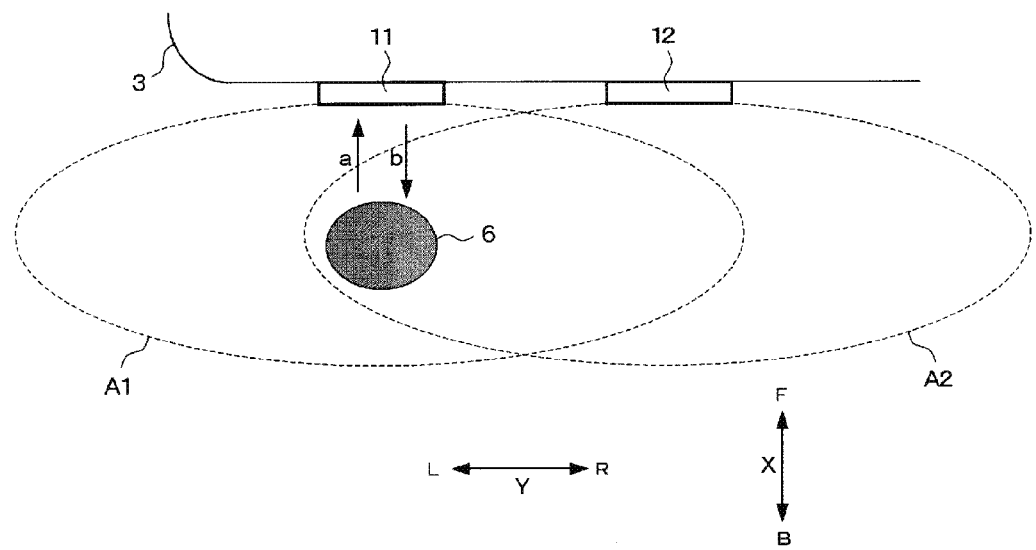
FIG. 6 is an explanatory partial plan view on the leg motion in the vehicle anteroposterior direction.

FIG. 6 depicts a relation between the sensor detection areas and the position of the leg. As described earlier, the detection areas of the adjacent sensors partially overlap with each other. In a state where the leg 6 faces the sensor 11, the leg 6 is located at the center in the detection area A1 of the sensor 11 as well as at an end of the detection area A2 of the adjacent sensor 12. When the leg 6 moves in directions a and b to execute the kicking motion in this state, the sensors 11 and 12 output detection signals having waveforms indicated in FIG. 7.

Figure 7:
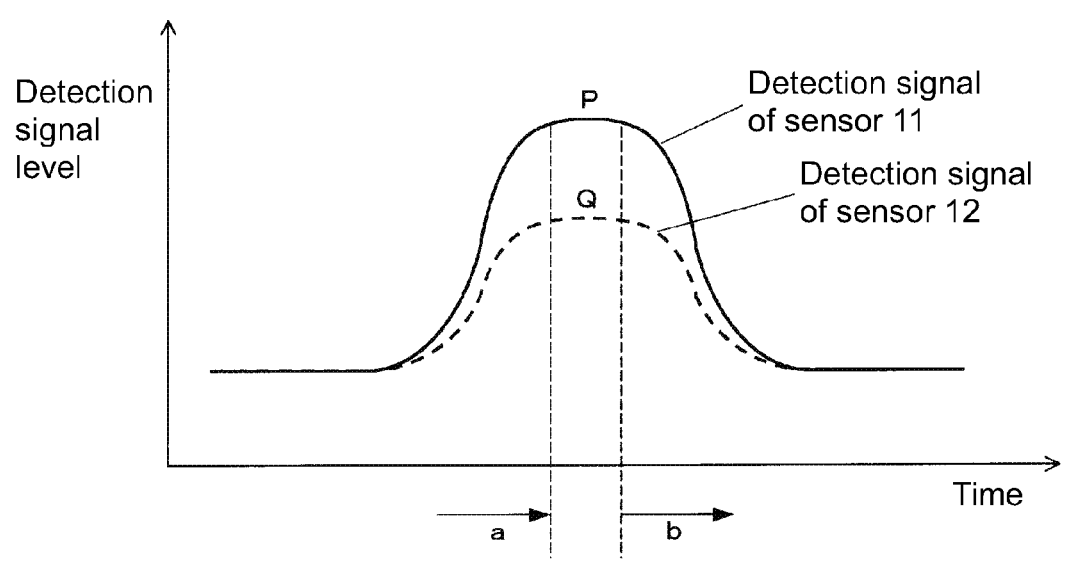
FIG. 7 is a waveform diagram of detection signals output from the sensors.

FIG. 7 indicates a detection signal P of the sensor 11 and a detection signal Q of the sensor 12. Both the detection signals P and Q improve in signal level as the leg 6 approaches the sensors and deteriorate in signal level as the leg 6 moves away from the sensors. However, the detection signal Q is lower in signal level than the detection signal P, since the sensor 11 detects the leg 6 at the center in the detection area A1 with higher sensitivity whereas the sensor 12 detects the leg 6 at the end in the detection area A2 with lower sensitivity.

The binary signal generator 32 in the controller 30 (FIG. 3) binarizes these detection signals P and Q to convert the analog detection signals P and Q to binary signals. Such binarization will be described in detail below.

Figure 8A:
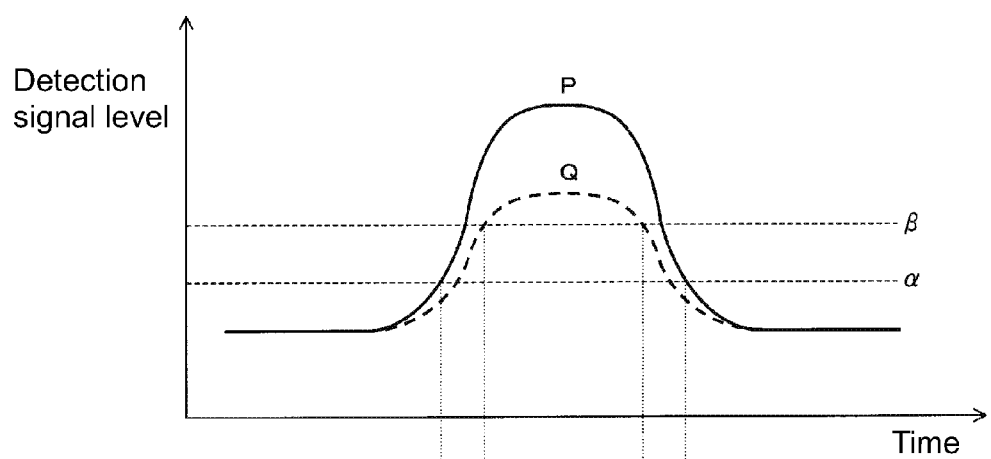
FIGS. 8A and 8B are waveform diagrams of the detection signals and binary signals.

When any one of the sensors 11 to 14 detects the leg 6, the binary signal generator 32 converts a detection signal (first detection signal) of this sensor to a binary signal with reference to the threshold $\alpha$ (first threshold) set to a predetermined signal level. As indicated in FIG. 8A, in the detection signals P and Q of the sensors 11 and 12, the detection signal P of the sensor 11 initially exceeds the threshold $\alpha$. By setting the detection signal P as the first detection signal, as well as a portion thereof exceeding the threshold $\alpha$ to "1" and a portion thereof not exceeding the threshold $\alpha$ to "0", the detection signal P is converted to a binary signal Px (first binary signal) as indicated in FIG. 8B.

The binary signal generator 32 also raises the threshold for the detection signal Q (second detection signal) of the sensor 12 adjacent to the sensor 11 at the timing when the sensor 11 detects the leg 6. Specifically, the threshold $\alpha$ having been referred to is changed to the threshold $\beta$ (second threshold) larger than the threshold $\alpha$, as indicated in FIG. 8A. By setting, of the detection signal Q outputted from the sensor 12, a portion exceeding the threshold $\beta$ to "1" and a portion not exceeding the threshold $\beta$ to "0", the detection signal Q is converted to a binary signal Qx (second binary signal) as indicated in FIG. 8B.

Figure 8B:
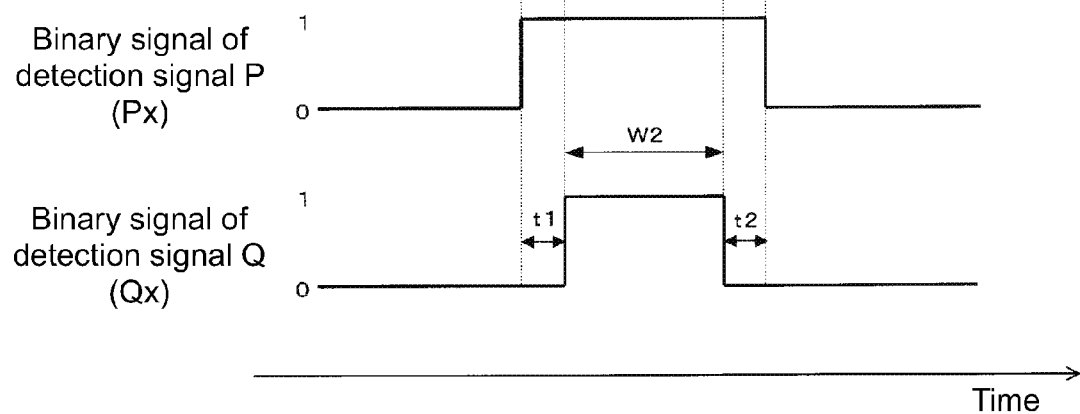

As apparent from FIG. 8B, the binary signal Qx has an output period W2 (the period at the level "1") contained in an output period W1 (the period at the level "1") of the binary signal Px. Specifically, the binary signal Qx rises after the binary signal Px rises and the binary signal Px falls after the binary signal Qx falls.

The binary signals Px and Qx having such a relation indicate that the leg 6 executes the kicking motion depicted in FIGS. 5A and 5B. Conversely, when the leg 6 executes the kicking motion, the output period W2 of the binary signal Qx obtained from the detection signal Q of the sensor 12 is entirely contained in the output period W1 of the binary signal Px obtained from the detection signal P of the sensor 11.

The threshold $\beta$ for the detection signal Q of the sensor 12 is larger than the threshold $\alpha$ in this case. As indicated in FIG. 8B, it is thus possible to sufficiently secure a rising time difference t1 and a falling time difference t2 between the binary signals Px and Qx. Accordingly, the output period W2 can reliably be contained in the output period W1.

The binary signal determiner 33 in the controller 30 (FIG. 3) compares the output period W1 of the binary signal Px and the output period W2 of the binary signal Qx, and determines that the leg 6 has executed the kicking motion if the output period W2 is contained in the output period W1 as described above. In contrast, if the output period W2 is not contained in the output period W1, the binary signal determiner 33 determines that the motion of the leg 6 does not correspond to the kicking motion. The latter case will be exemplarily described below with reference to FIGS. 9 to 12B.

Figure 9:
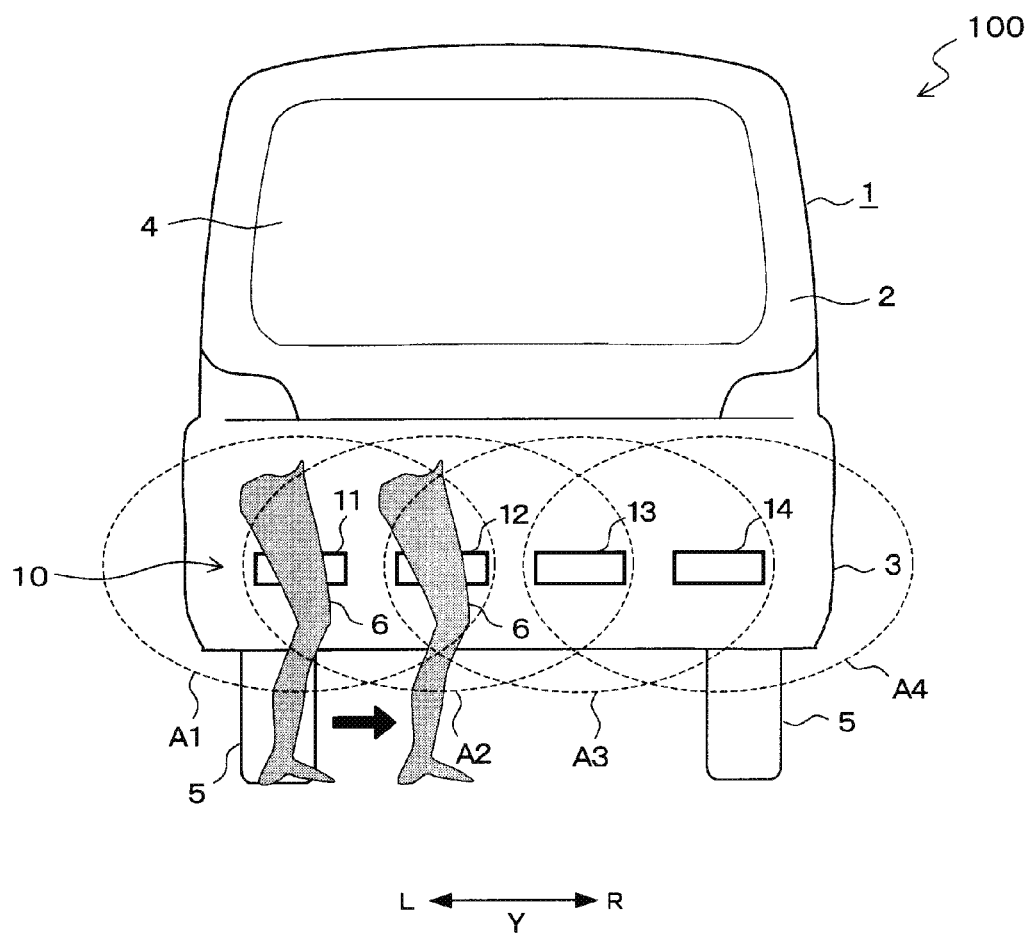
FIG. 9 is an explanatory view on leg detection by the sensors.
Figure 10:
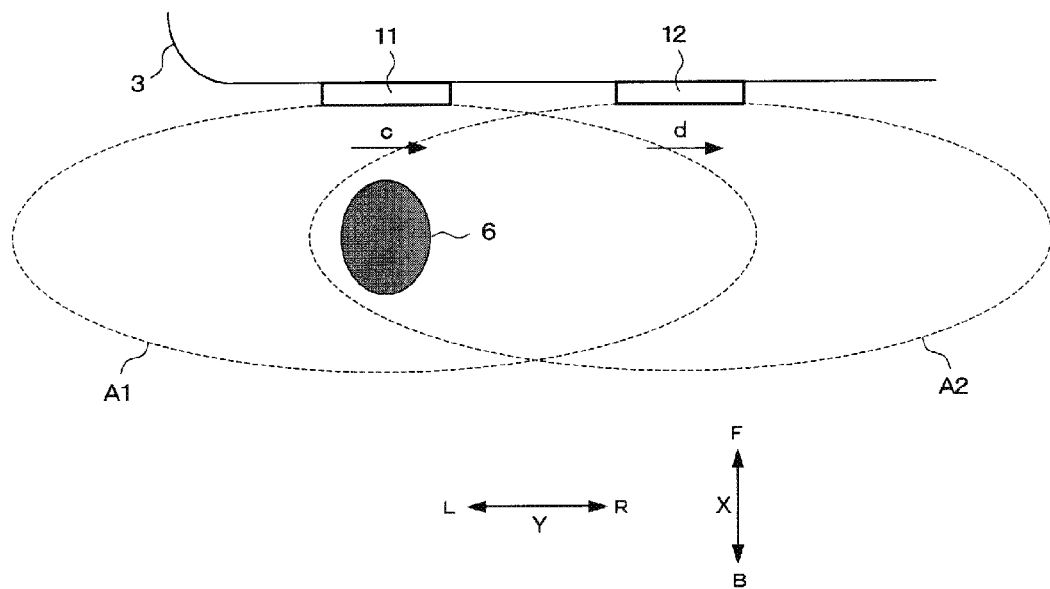
FIG. 10 is an explanatory partial plan view on a leg movement in a vehicle lateral direction.

FIG. 9 depicts a state where the user passes by behind the vehicle 100 in the array direction (Y direction) of the sensors 11 to 14. The sensors 11 and 12 detect the leg 6 also in this case. However, the sensors 11 and 12 output the detection signals P and Q having waveforms as indicated in FIG. 11, since the leg 6 moves in directions c and d and shifts from the detection area A1 of the sensor 11 to the detection area A2 of the sensor 12 as depicted in FIG. 10.

Figure 11:
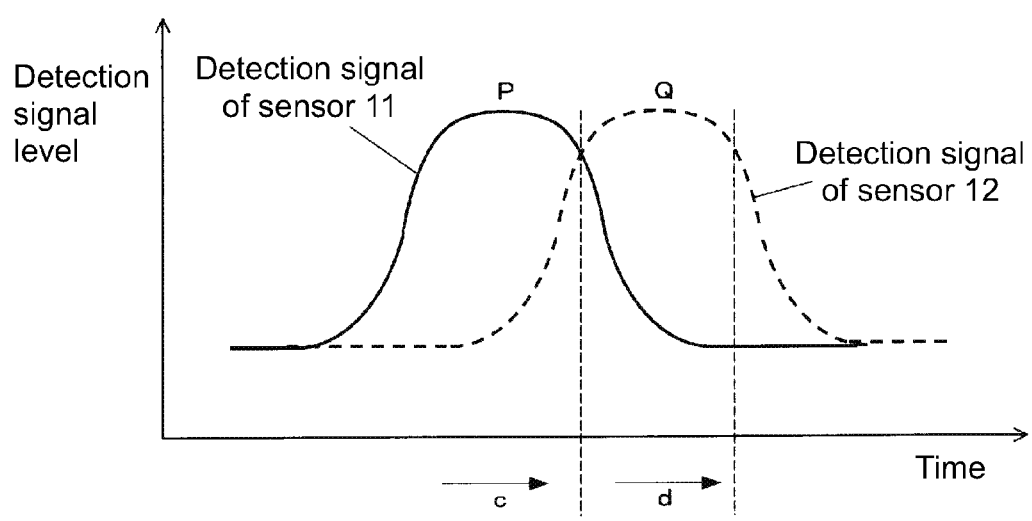
FIG. 11 is a waveform diagram of detection signals outputted from the sensors.

As apparent from FIG. 11, the detection signals P and Q are equivalent in signal level and the detection signal Q is outputted after the detection signal P is outputted. Also in this case, the binary signal generator 32 binarizes the detection signals P and Q to be converted to the binary signals Px and Qx as indicated in FIGS. 12A and 12B.

Figure 12A:
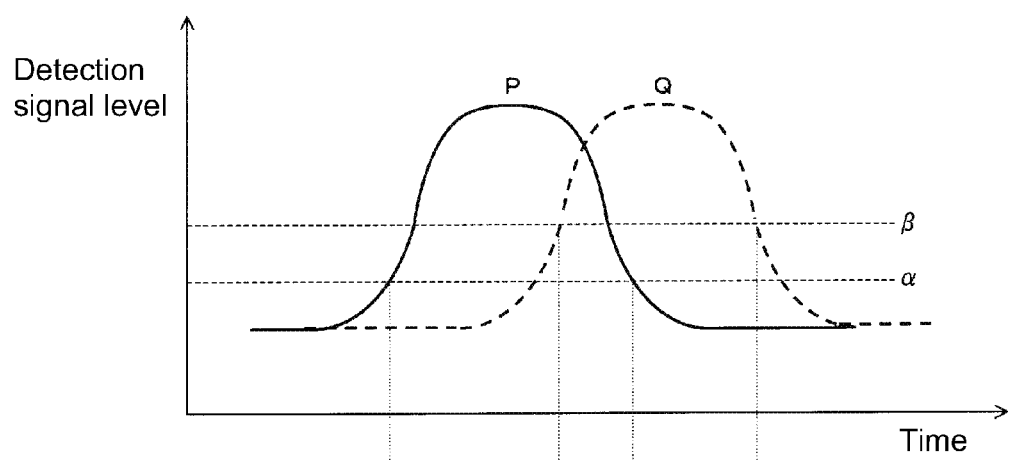
FIGS. 12A and 12B are waveform diagrams of the detection signals and binary signals.
Figure 12B:
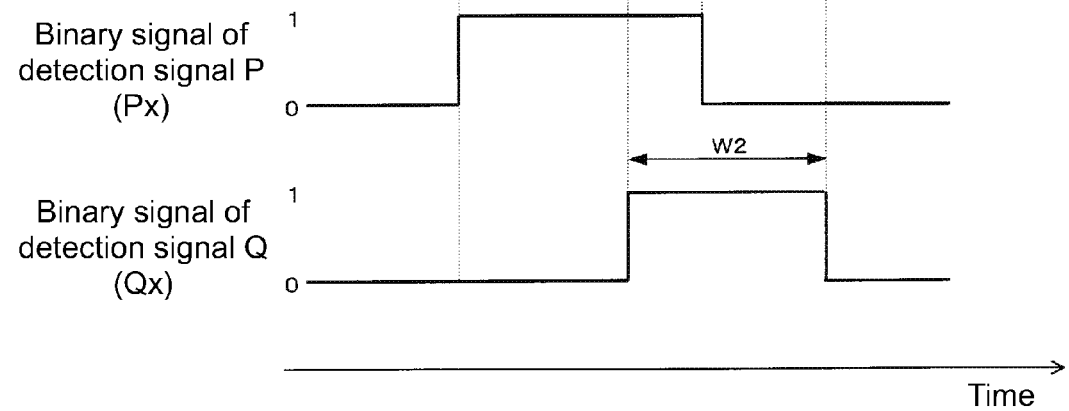

As indicated in FIGS. 12A and 12B, the binary signal generator 32 converts the detection signal P (first detection signal) of the sensor 11 to the binary signal Px with reference to the threshold $\alpha$ (first threshold). The binary signal generator 32 also raises the threshold for the detection signal Q (second detection signal) of the sensor 12 adjacent to the sensor 11 at the timing when the sensor 11 detects the leg 6. Specifically, the threshold $\alpha$ having been referred to is changed to the threshold $\beta$ (second threshold) larger than the threshold α. The detection signal Q is converted to the binary signal Qx with reference to the threshold β.

As apparent from FIG. 12B, the output period W2 (the period at the level "1") of the binary signal Qx is not contained in the output period W1 (the period at the level "1") of the binary signal Px. Specifically, although the binary signal Qx rises after the binary signal Px rises, the binary signal Px falls before the binary signal Qx falls.

The binary signals Px and Qx having such a relation indicate that the leg 6 executes the shifting motion in the sensor array direction (Y direction) as depicted in FIG. 9. Conversely, when the leg 6 moves in the sensor array direction, the output period W2 of the binary signal Qx obtained from the detection signal Q of the sensor 12 is not entirely contained in the output period W1 of the binary signal Px obtained from the detection signal P of the sensor 11.

It is checked in this manner whether or not the binary signals Px and Qx have the predetermined relation, particularly, whether or not the output period W2 of the binary signal Qx is contained in the output period W1 of the binary signal Px. It is thus possible to determine whether the motion of the leg 6 corresponds to the kicking motion depicted in FIGS. 5A and 5B or the simple passing motion depicted in FIG. 9.

In the controller 30, if the key information checker 31 determines that matching is successful and the binary signal determiner 33 determines that the motion of the leg 6 corresponds to the kicking motion, the locking state determiner 34 determines whether or not the rear door 2 is being locked. If the rear door 2 is being locked, the controller 30 transmits an unlock command signal to the rear door lock-unlock unit 50 and transmits a door open command signal to the rear door open-close unit 40. If the rear door 2 is not being locked, the controller 30 does not transmit any unlock command signal to the rear door lock-unlock unit 50 but transmits a door open command signal to the rear door open-close unit 40.

In contrast, if the key information checker 31 determines that matching is unsuccessful or if the binary signal determiner 33 determines that the motion of the leg 6 does not correspond to the kicking motion, the controller 30 does not transmit any door open command signal to the rear door open-close unit 40 and does not transmit any unlock command signal to the rear door lock-unlock unit 50.

When receiving the unlock command signal from the controller 30, the rear door lock-unlock unit 50 drives the actuator and unlocks the rear door 2. When receiving the door open command signal from the controller 30, the rear door open-close unit 40 drives the motor and opens the rear door 2. The rear door 2 can thus be opened automatically and contactlessly with the kicking motion of the leg 6.

Figure 13:
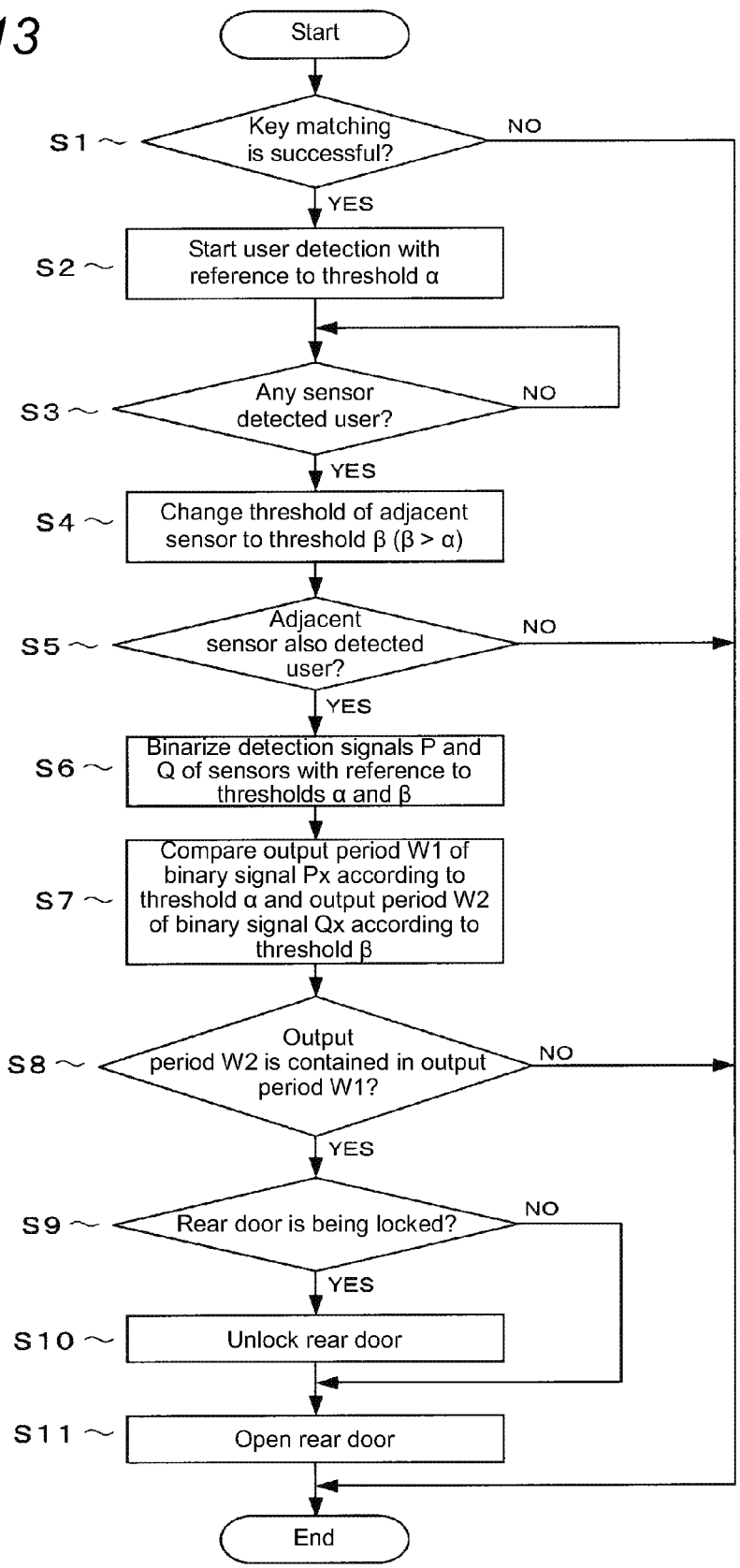
FIG. 13 is a flowchart of behavior of the vehicle door open-close control device.

FIG. 13 is a flowchart on the above-described behavior of the vehicle door open-close control device 200. The controller 30 executes the respective steps in this flowchart.

In step S1, the key information checker 31 checks whether or not the key ID received from the portable machine and the key ID stored in the storage 35 match each other. The key information checker 31 determines that matching is successful if the key IDs match each other and determines that matching is unsuccessful if the key IDs do not match each other. If matching is successful (YES in step S1), the processing flow proceeds to step S2. If matching is unsuccessful (NO in step S1), the processing flow ends with no execution of the processing in steps S2 to S11.

In step S2, the sensors 11 to 14 start user detection with reference to the threshold α.

Determined in step S3 is whether or not any one of the sensors 11 to 14 detects the user. If none of the sensors detects the user (NO in step S3), the vehicle door open-close control device 200 stands by until the user is detected. If any one of the sensors detects the user (YES in step S3), the processing flow proceeds to step S4.

In step S4, the threshold of any one of the sensors adjacent to the sensor having detected the user in step S3 is changed to the threshold β (β>α).

Determined in step S5 is whether or not the adjacent sensor has also detected the user. If the adjacent sensor does not detect the user (NO in step S5), the processing flow ends. If the adjacent sensor detects the user (YES in step S5), the processing flow proceeds to step S6.

In step S6, the binary signal generator 32 binarizes the detection signals of the sensors with reference to the thresholds α and β to be converted to binary signals.

In step S7, the binary signal determiner 33 compares the output period W1 of the binary signal Px obtained by binarization with reference to the threshold α and the output period W2 of the binary signal Qx obtained by binarization with reference to the threshold β.

Determined in step S8 is whether or not the output period W2 of the binary signal Qx is contained in the output period W1 of the binary signal Px. Specifically, determined is whether or not the binary signal Qx rises after the binary signal Px rises and the binary signal Px falls after the binary signal Qx falls.

If determined in step S8 that the output period W2 of the binary signal Qx is not contained in the output period W1 of the binary signal Px as indicated in FIG. 12B (NO in step S8), the motion of the leg 6 is determined as not corresponding to the kicking motion and the processing flow ends. In contrast, if the output period W2 of the binary signal Qx is contained in the output period W1 of the binary signal Px as indicated in FIG. 8B (YES in step S8), the motion of the leg 6 is determined as corresponding to the kicking motion and the processing flow proceeds to step S9.

In step S9, the locking state determiner 34 determines whether or not the rear door 2 is being locked. If the rear door 2 is being locked (YES in step S9), the processing flow proceeds to step S10. If the rear door 2 is not being locked (NO in step S9), the processing flow proceeds to step S11 with skipping the processing in step S10.

In step S10, the controller 30 transmits, to the rear door lock-unlock unit 50, an unlock command signal for allowing the rear door 2 to be unlocked. The rear door 2 accordingly shifts from the locked state to the unlocked state.

In step S11, the controller 30 transmits, to the rear door open-close unit 40, a door open command signal for allowing the rear door 2 to be opened. The rear door open-close unit 40 having received this signal opens the rear door 2.

In an illustrative embodiment, the plurality of sensors 11 to 14 included in the detector 10 are arrayed in the horizontal direction (Y direction) such that the detection areas A1 to A4 of the adjacent sensors partially overlap with each other. If any one of the sensors outputs the detection signal P, the threshold for the detection signal Q of one of the sensors adjacent to the sensor is raised and the detection signals P and Q of these sensors are converted to the binary signals Px and Qx. The output periods W1 and W2 of the binary signals Px and Qx are subsequently compared with each other. If the output period W2 is contained in the output period W1, it is determined that the kicking motion has been executed to open the rear door 2, and the rear door 2 is thus opened.

Figure 17:
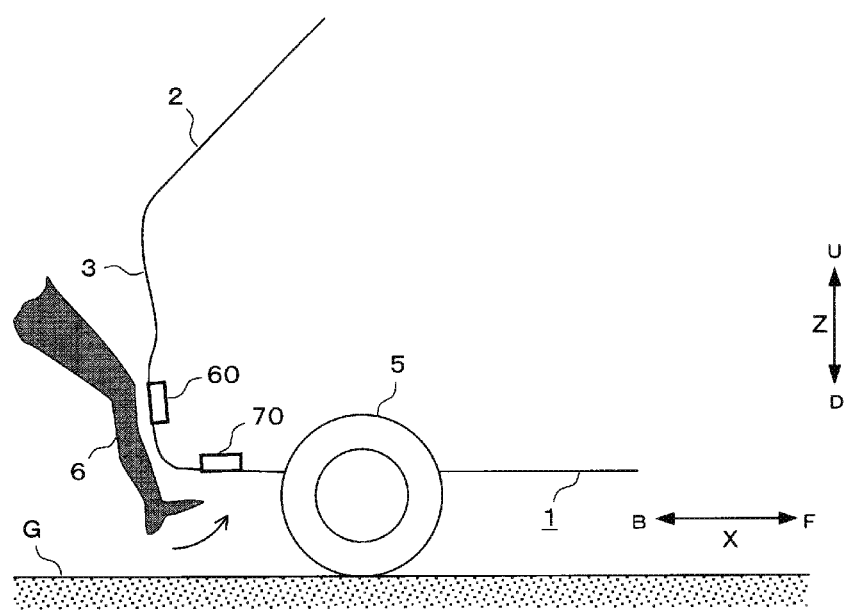
FIG. 17 is a partial side view of the vehicle.

The vehicle door open-close control device according to one or more embodiments of the disclosure does not need the sensor 70 (FIG. 17) disposed at the far portion of the bottom of the vehicle body 1 as in JP 2014-500414 W, and has no restraint on sensor mounting positions. Whether or not the kicking motion is executed can be determined in accordance with the result of comparison between the output periods W1 and W2 of the binary signals Px and Qx converted from the detection signals P and Q. The vehicle door open-close control device does not need the plurality of detection patterns or the control program that covers the detection patterns as in JP 2014-9470 A. The vehicle door open-close control device is thus simplified in its design and processing, and can prevent erroneous detection of the kicking motion in such a simple configuration.

In this embodiment, the binary signal Px is generated from the detection signal P with reference to the threshold α whereas the binary signal Qx is generated from the detection signal Q with reference to the threshold β larger than the threshold α. The output period W2 of the binary signal Qx can thus be contained reliably in the output period W1 of the binary signal Px as indicated in FIG. 8B. This leads to improvement in detection accuracy of the kicking motion.

The disclosure can include the following various embodiments in addition to an illustrative embodiment.

Figure 14A:
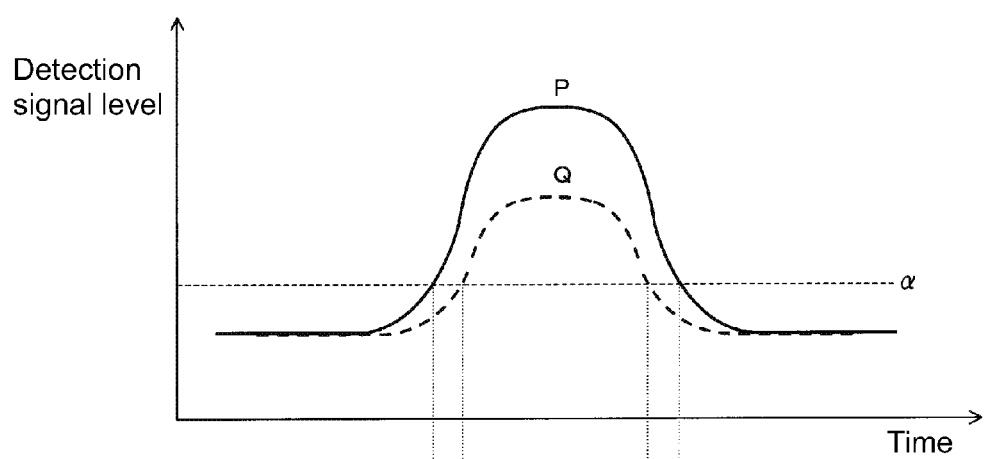
FIGS. 14A and 14B are waveform diagrams of detection signals and binary signals according to another embodiment.
Figure 14B:
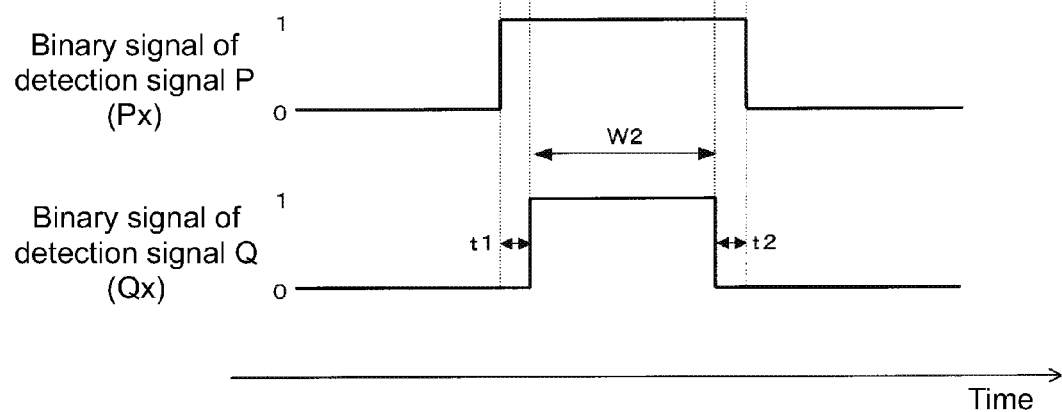

In an illustrative embodiment, the binary signals Px and Qx are generated with reference to the two different thresholds α and β. Alternatively, the binary signals Px and Qx can be generated with reference to a single threshold depending on sensor properties (detection areas, sensitivity, and the like). FIGS. 14A and 14B exemplify a case where the binary signals Px and Qx are generated with reference only to the threshold α. Even in such a case of referring to the single threshold, the rising time difference t1 and the falling time difference t2 between the binary signals Px and Qx can be secured for at least a certain period if the detection signal Q varies relatively gently in comparison to the detection signal P. The output period W2 of the binary signal Qx can thus be contained in the output period W1 of the binary signal Px.

Figure 15A:
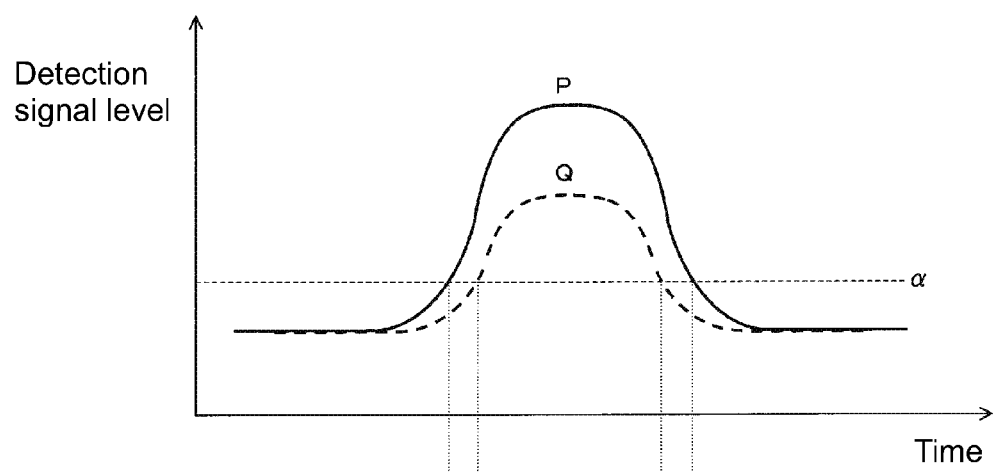
FIGS. 15A and 15B are waveform diagrams of detection signals and trigger pulses according to another embodiment.
Figure 15B:
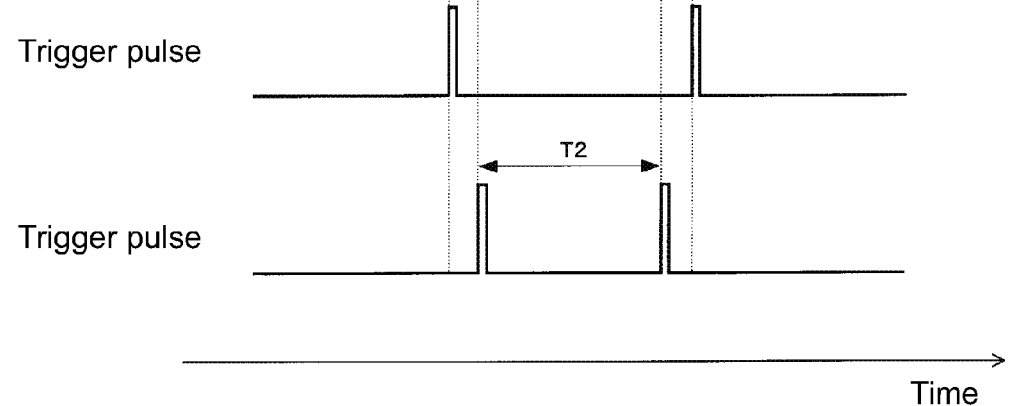
Figure 16:
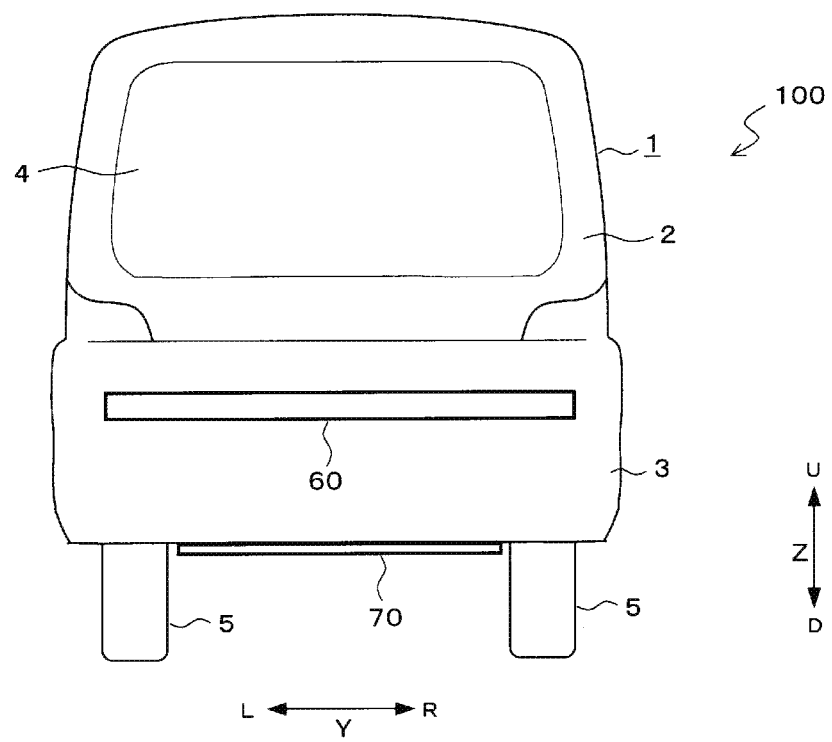
FIG. 16 is a rear view of a vehicle equipped with sensors according to JP 2014-500414 W.

In an illustrative embodiment, the detection signals P and Q are converted to the binary signals Px and Qx with reference to the thresholds. Alternatively, the disclosure can adopt any other method. For example, as indicated in FIGS. 15A and 15B, short trigger pulses may be generated at the timing when the waveforms of the detection signals P and Q cross the line of the threshold α, and output periods (the periods of the waveforms exceeding the threshold α) T1 and T2 of the detection signals P and Q may be measured, to determine whether or not the output period T2 of the detection signal Q is contained in the output period T1 of the detection signal P.

In an illustrative embodiment, the detection signals P and Q are each binarized by setting the portion exceeding the threshold to "1" and the portion not exceeding the threshold to "0". Alternatively, the portion exceeding the threshold may be set to "0" and the portion not exceeding the threshold may be set to "1" for binarization of each of the detection signals P and Q. In this case, the output periods W1 and W2 of the binary signals Px and Qx correspond to the periods at the level "0".

An illustrative embodiment exemplifies the capacitance proximity sensors as the sensors 11 to 14. The sensors 11 to 14 can alternatively be any other sensors such as reflection optical sensors or ultrasonic sensors. The sensors 11 to 14 may each include a single sensor element or a plurality of sensor elements.

An illustrative embodiment exemplifies the case of detecting the kicking motion of moving the leg 6 in the anteroposterior direction X. Alternatively detected may be a kicking motion of moving the leg 6 in the lateral direction Y or a diagonal direction. Accordingly, the relation between the detection signals P and Q is not limited to that the output period W2 of the binary signal Qx is contained in the output period W1 of the binary signal Px or the output period T2 of the detection signal Q is contained in the output period T1 of the detection signal P. The rear door 2 may be opened under a condition that any other relation is satisfied.

An illustrative embodiment refers only to opening the rear door 2. The disclosure is also applicable, in addition to the case of opening the rear door 2, to a case of closing the rear door 2. In this case, the rear door 2 is closed under conditions that the rear door 2 is open, the key information checker 31 checks to find that matching is successful (the key IDs match each other), and the kicking motion described above is detected again.

An illustrative embodiment exemplifies the kicking motion as a user leg motion. The kicking motion can be replaced with any other motion. For example, the leg motion can correspond to linearly moving forward the leg into the detection areas A1 to A4 of the sensors 11 to 14 and subsequently moving the leg away from the detection areas A1 to A4.

An illustrative embodiment, the user is detected in accordance with the leg motion. Alternatively, the user may be detected in accordance with a motion of an arm or the like, instead of the leg motion.

An illustrative embodiment exemplifies the rear door 2. Alternatively, the rear door 2 may be replaced with a sliding door. In this case, the sensors included in the detector 10 are disposed in the vicinity of the sliding door at a lateral end of the vehicle 100. Still alternatively, the rear door 2 may be replaced with a door that is provided to open or close a trunk.

While the invention has been described with reference to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

The invention claimed is:

1. A vehicle door open-close control device comprising:
    a detector disposed in a vicinity of a vehicle door and configured to detect a user in a preliminarily set detection area; and
    a controller configured to open the vehicle door if the detector detects the user;
    wherein the detector comprises a plurality of sensors horizontally arrayed in the vicinity of the vehicle door,
    wherein the plurality of sensors is disposed so as to allow detection areas of adjacent sensors to overlap with each other,
    wherein the controller
        compares, when a first sensor of the plurality of sensors detects the user, a first detection signal of the first sensor and a second detection signal of a second sensor of the plurality of sensors adjacent to the first sensor, and opens the vehicle door if the detection signals satisfy a predetermined relation.

2. The vehicle door open-close control device according to claim 1,
    wherein the controller
        converts the first detection signal to a first binary signal with reference to a first threshold set to a predetermined signal level and converts the second detection signal to a second binary signal with reference to a second threshold larger than the first threshold, compares an output period of the first binary signal and an output period of the second binary signal, and opens the vehicle door if the output period of the second binary signal is contained in the output period of the first binary signal.

3. The vehicle door open-close control device according to claim 1, wherein the controller converts the first detection signal to a first binary signal with reference to a threshold set to a predetermined signal level and converts the second detection signal to a second binary signal with reference to the threshold, compares an output period of the first binary signal and an output period of the second binary signal, and opens the vehicle door if the output period of the second binary signal is contained in the output period of the first binary signal.

4. The vehicle door open-close control device according to claim 3, wherein the controller opens the vehicle door if the second binary signal rises after the first binary signal rises and the first binary signal falls after the second binary signal falls.

5. The vehicle door open-close control device according to claim 1, wherein the controller compares an output period of the first detection signal and an output period of the second detection signal at a predetermined signal level, and opens the vehicle door if the output period of the second detection signal is contained in the output period of the first detection signal.

* * * * *